United States Patent [19]
Faulkner et al.

[11] Patent Number: 5,963,070
[45] Date of Patent: Oct. 5, 1999

[54] STRETCH CYCLE GENERATOR

[75] Inventors: Darren R. Faulkner; Gregory A. Constant, both of Austin, Tex.

[73] Assignee: Advanced Micro Devices, Inc., Sunnyvale, Calif.

[21] Appl. No.: 08/867,317

[22] Filed: Jun. 2, 1997

[51] Int. Cl.⁶ .................................. G06F 3/04; H03K 5/04
[52] U.S. Cl. ........................ 327/174; 327/172; 327/175; 327/176; 327/156; 364/222.2
[58] Field of Search ....................... 327/172, 174, 327/175, 176, 156, 147; 364/222.2

[56] References Cited

U.S. PATENT DOCUMENTS

| | | | |
|---|---|---|---|
| 4,458,308 | 7/1984 | Holtey et al. ............................ | 364/200 |
| 4,727,331 | 2/1988 | Hegeler .................................... | 327/175 |
| 5,045,715 | 9/1991 | Fitch ....................................... | 327/174 |

*Primary Examiner*—Dinh Le
*Attorney, Agent, or Firm*—Skjerven, Morrill, MacPherson, Franklin & Friel, L.L.P.

[57] ABSTRACT

A clock generating circuit includes a clock generator and a cycle controller. The clock generator is coupled to receive a reference oscillating signal. The clock generator provides a clock signal responsive to the reference oscillating signal. The cycle controller is coupled to provide a cycle control signal to the clock generator. The clock generator stretches a cycle of the clock signal responsive to a first value of the cycle control signal.

18 Claims, 7 Drawing Sheets

STRETCH CYCLE GENERATOR

BACKGROUND

1. Field of the Invention

The present invention relates to computer systems, and, more particularly, to clock generation and debugging techniques.

2. Description of the Related Art

Computer systems are information handling systems which can be designed to give independent computing power to single or multiple users. Computer systems have attained widespread use and may be found in many forms including mainframes, minicomputers, workstations, file servers, embedded systems and personal computer systems. Computer systems, such as the International Business Machines (IBM) compatible personal computer system, typically include a processor, memory, and various input/output (I/O) devices. A personal computer system is usually distinguishable by the use of a system board to electrically connect these components together. Computer systems may include more than one processor chip. For example, a personal computer system board may include two processors, one for general control and integer calculations and one for floating point or multimedia applications.

Computer systems operate according to various system clocks. Typically, an external clock is supplied to a processor which uses the external clock to generate a processor clock. If the external clock frequency is equal to the processor clock frequency, each clock is referred to as a 1X clock. Alternatively, the external clock may be modified internally by the processor so that the clocks have different frequencies. For example, a processor may double the frequency of the external clock to generate a 2X processor clock. Because the internal processor clock operates at twice the frequency of the supplied external clock, the external clock can be lower than would otherwise be necessary. The external clock is typically doubled by the processor to avoid electromagnetic emission problems that occur at higher external clock frequencies (e.g., 100 MHz or more) and to avoid high frequency difficulties that can occur at the pads of a processor.

Computer systems are often debugged using debug testers. An exemplary debug tester is the J971 brand debug tester available from Teradyne. Debug testers such as the J971 often input an array of predetermined information to the processor. Each line of the input array typically corresponds to the input signals during one clock cycle. The debug tester clocks the processor while inputting successive lines of the input array. The debug tester receives an array of output information from the processor. The received output array is then compared to an array of expected output information to check for errors.

Debug testers are often used to test time-critical paths or "speed paths." Speed paths exist where the combinational delay through a path of a circuit is greater than the time allocated for that path. Thus, latches at the end of a speed path close without a valid input, possibly resulting in incorrect data being driven to the processor outputs. For example, if a debug tester determines that a line of the received output array is not the same as the corresponding line of the expected output array, a speed path may exist. However, the speed path that caused the output error could have caused the error many clock cycles prior to the clock cycle of the unexpected output. Accordingly, the cycle in which the speed path occurred must be determined.

When a speed path failure occurs during debug analysis, stretch or slowdown cycles may be used to isolate the internal device failing cycle. A stretch cycle extends the period of a clock in a particular cycle when a speed path could exist. The extra time resulting from the increased clock period usually allows sufficient propagation time to produce valid circuit outputs. For example, if a particular path has an 11.5 ns propagation time, and the clock period is 10 ns, the particular path is a speed path. By stretching the clock period to, e.g., 20 ns, sufficient time is given for the signal to propagate through the path.

Upon discovering a speed path error in the output array, the debug tester reapplies the input array to the processor inputs a number of times. A different clock cycle is stretched during each application of the input array until a pass condition (expected data equals received data) exists for the line of the array in which the initial discrepancy occurred. By stretching the clock period of the first clock cycle during a first test run, and then stretching the clock periods of subsequent clock cycles during subsequent test runs, the clock cycle in which the speed path occurred is discovered. Since the stretching of the clock period permitted the signal to propagate through the speed path, the stretched cycle of the test run in which valid outputs are obtained indicates in which cycle the speed path occurred.

For example, if an error occurred in line 50 of the output array (i.e., cycle 50), the speed path may have occurred in any of cycles 1–49. Therefore, the debug tester applies the input array and stretches clock cycle 1. Next, the debug tester applies the input array and stretches clock cycle 2, and so on. If, e.g., a pass condition exists for line 50 in test run 45, then the clock cycle that was stretched in test run 45 (e.g., cycle 45) is the clock cycle in which the speed path error occurred that caused the discrepancy in line 50.

Stretch cycles in the 1X static clock may be used to isolate the internal device failing cycle. Changing the period of a single phase is straightforward when using a 1X static clock since the external clock is used to directly produce the internal clock phases. Thus, the stretch cycles can be provided by the external clock.

As system clock frequencies increase, the use of debug testers to test computer systems becomes increasingly problematic. For example, debug testers that test speed paths can typically test computer systems having a system clock frequency within a predetermined frequency range. When a processor exceeds the debug tester's maximum frequency, a new debug tester must be acquired in order to test speed paths on the higher frequency processor.

SUMMARY

It has been discovered that by providing a stretch cycle generator on the processor chip, speed path debug operations may be performed on a processor with a frequency greater than the maximum frequency of a corresponding debug tester. Such an apparatus provides the advantage that high frequency speed path debug operations may be accommodated without the use of high frequency debug testers. Furthermore, debug testing may be conducted at the speed of the processor. Also, by providing a stretch cycle generator within the system being tested, difficulties in stretching clocks due to phase-locked loops (PLLs) are avoided.

In one embodiment of the present invention, a clock generating circuit includes a clock generator and a cycle controller. The clock generator is coupled to receive a reference oscillating signal. The clock generator provides a clock signal responsive to the reference oscillating signal. The cycle controller is coupled to provide a cycle control signal to the clock generator. The clock generator stretches a cycle of the clock signal responsive to a first value of the cycle control signal.

In another embodiment, an apparatus for stretching clock signals includes a stretch control circuit and a stretch functional circuit. The stretch control circuit is coupled within a computer system to receive a debug signal. The stretch control circuit provides at least one control signal responsive to the debug signal. The stretch functional circuit is coupled within the computer system to receive at least one state information select signal corresponding to the at least one control signal from the stretch control circuit. The stretch functional circuit is further coupled to receive a reference clock signal. The stretch functional circuit is for providing a plurality of apparatus clock signals proportional to the reference clock signal. The stretch functional circuit stretches at least one of the apparatus clock signals responsive to the state information select signal.

In another embodiment, an apparatus for stretching clock signals includes means for providing a control signal indicative of a debug stretch cycle, means for receiving a reference oscillating signal, means for providing a clock signal proportional to the reference oscillating signal, and means for stretching the period of the clock signal responsive to a first value of the control signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of a preferred embodiment. The description is intended to be illustrative of the invention and should not be taken to be limiting. Many variations, modifications, additions, and improvements may fall within the scope of the invention as defined in the claims that follow.

In one embodiment, a clock generation circuit in a processor includes a clock generator and a stretch cycle sequencer on an integrated processor. The clock generator receives a voltage-controlled oscillator (VCO) signal and generates therefrom the processor clocks necessary for the processor. The stretch cycle sequencer provides added speed path debug capability by stretching certain cycles of the processor clocks responsive to a debug input signal.

Figure 1:
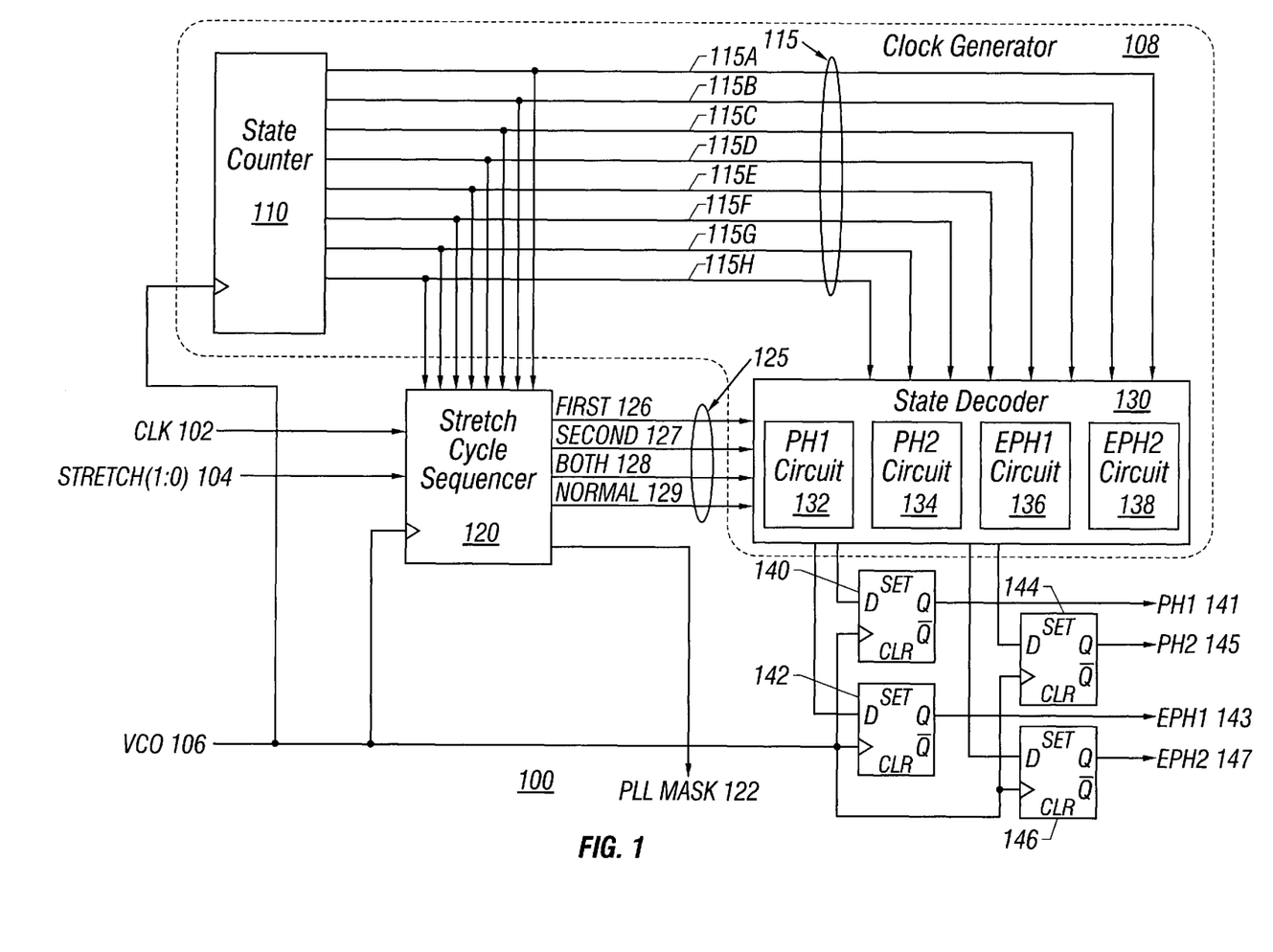
FIG. 1 shows a clock generation circuit in a processor of an information processing system according to an embodiment of the present invention.

FIG. 1 depicts a clock generation circuit 100 according to an embodiment of the invention. Clock generation circuit 100 includes clock generator 108, stretch cycle sequencer 120 and registers 140, 142, 144, 146. Clock generator 108 includes state counter 110 and state decoder 130. State counter 110 provides clock generator states to state decoder 130 over state lines 115. State decoder 130 decodes the states to provide preregistered clock signals to registers 140, 142, 144, 146. Registers 140, 142, 144, 146 receive preregistered clock signals from the clock generator and provide the processor clocks PH1, PH2, EPH1 and EPH2. Stretch cycle sequencer 120 receives the state inputs from state counter 110 over lines 115 and a 2-bit debug control signal 104 (STRETCH). Stretch cycle sequencer 120 provides cycle control signals 125 to state decoder 130 to control when stretch cycles are issued by state decoder 130. More specifically, stretch cycle sequencer 120 provides a first cycle control signal 126 (FIRST), a second cycle control signal 127 (SECOND), a both cycles control signal 128 (BOTH) and a normal operation control signal 129 (NORMAL). A voltage-controlled oscillator signal VCO from a phase-locked loop (PLL) circuit (see, e.g., PLL 722 of FIG. 7) clocks state counter 110, stretch cycle sequencer 120 and registers 140, 142, 144, and 146.

In the embodiment of FIG. 1, clock generation circuit 100 is integrated into a microprocessor of a personal computer system. In other embodiments, clock generation circuit 100 is included in various information processing systems to provide an in-system stretch cycle capability. Also, although clock generator 108 uses a state counter and decoder combination to generate system clocks, other circuits may be used to perform similar functionality. For example, any appropriate state generator with corresponding decode and detection functionality may be provided in accordance with the invention. Furthermore, although registers 140, 142, 144 and 146 are separate from clock generator 108 in the embodiment of FIG. 1, registers 140, 142, 144 and 146 may be included in clock generator 108 in other embodiments.

For clarity, only logic for the 2X processor clock mode is shown in the embodiment of FIG. 1. It is understood, however, that the invention is not limited to the 2X clock mode, but that other embodiments of the invention may use different clock modes (such as 3X, 4X and 1.5X clock modes) either individually or in some combination.

Referring to FIG. 1, state counter 110 is a ring counter which sequentially and alternately produces a pulse on each state line 115A–H. That is, a pulse is issued on state line 115A ("state A"), then on state line 115B ("state B"), and so on to state line 115H ("state H"), and then to state line 115A ("state A") again. (See, e.g., FIGS. 3–6.) State counter 110 runs in an infinite loop by repeatedly cycling through states A–H responsive to VCO. Thus, state counter 110 generates a sequence of states from a first state to a last state. Each state of the sequence of states has a corresponding next state in the sequence of states. The next state of the last state in the sequence of states is the first state in the sequence of states. State counter 110 repeatedly cycles through the sequence of states. State lines 115A–H are provided to stretch cycle sequencer 120 and state decoder 130.

Stretch cycle sequencer 120 stretch 104, external receiving debug signal stretch 104, external clock 102 (CLK), VCO 106, and state lines 115A–H. Stretch cycle sequencer 120 provides PLL mask signal 122 to PLL 722 and provides cycle control signals 125 to state decoder 130. In the embodiment of FIG. 1, stretch signal 104 is a two bit signal, and cycle control signals 125 include stretch first cycle signal 126, stretch second cycle signal 127, stretch both cycles signal 127, and normal clock operation signal 129.

In the embodiment of FIG. 1, stretch cycle sequencer 120 operates as a decoder on the two-bit wide debug signal stretch 104. To generate a stretch cycle, stretch signal 104 is asserted one external clock cycle before the required internal stretch cycle. On the next external clock, stretch cycle sequencer 120 generates the proper sequence of pulses on lines of cycle control signals 125 which are used by state decoder 130 to modify the main clock pulses being generated to create a stretch cycle.

Stretch cycle sequencer 120 receives the state signals 115A–H to ensure the cycle control signals are generated at the proper time. A stretch cycle may be generated during the first half of a state counter 110 cycle, during the second half of a state counter 110 cycle, or during both halves of a state counter 110 cycle. Processor clock EPH1 marks the beginning of the counter cycle, and processor clock EPH2 marks the end of the counter cycle.

When the processor clocks are generated internally by the processor, a phase lock loop (PLL 722) is typically used to maintain a period lock. Thus, the period of a single cycle of the external clock cannot be arbitrarily altered since the period consistency of the clock input is used to maintain the phase lock of the generated processor clocks. Changing the period of the input clock would not dramatically change the period of the processor clocks because PLL 722 maintains a period lock. While the control algorithm of the PLL 722 would alter the phase slightly, this sluggish variation would not likely be enough to use effectively in causing a failing speed path to begin passing.

Stretch cycle sequencer 120 provides PLL mask signal 122 to PLL 722 to disable phase locking during a stretch cycle. In one embodiment, clock signal EPH2 provides the feedback signal for the PLL 722. During each stretch cycle, an EPH1 pulse and an EPH2 pulse are missing. PLL mask signal 122 masks off the PLL's phase comparison which would have normally occurred during the missing EPH2 pulse.

This allows PLL 722 to maintain phase lock even though one EPH2 feed back pulse is missing during each stretch cycle. The PLL comparator is disabled by PLL mask signal 122 during the stretch cycle.

Stretch cycle sequencer 120 determines the value of PLL mask signal 122 according to the value of stretch signal 104. For example, in one embodiment, if the value of stretch signal 104 is 0, no stretch cycles will be implemented by state decoder 130 and PLL mask signal 122 is deasserted to allow phase locking on every cycle. If the value of the stretch signal 104 is not 0 (i.e., the value of stretch signal 104 is 1, 2 or 3), at least one processor cycle is stretched by state decoder 130 and PLL mask signal 122 is asserted to disable the PLL during the cycles which are stretched.

State decoder 130 uses cycle control signals 125 from stretch cycle sequencer 120 to determine which type of cycle stretch is performed on the system clocks, if any, by state decoder 130. Stretch cycle sequencer 120 determines the values of cycle control signals 125 according to the value of debug stretch signal 104. For example, in one embodiment, if the value of stretch signal 104 is 0, no stretch cycles will be implemented by state decoder 130. Consequently, normal clock operation 129 is asserted, and stretch first cycle 126, stretch second cycle 127, and stretch both cycles 128 are deasserted. If the value of stretch signal 104 is 3, a first doubled processor cycle is stretched by state decoder 130. Consequently, stretch first cycle 126 is asserted and signals 127, 128 and 129 are deasserted. If the value of stretch signal 104 is 1, a second doubled processor cycle is stretched by state decoder 130. Consequently, stretch second cycle 127 is asserted and signals 126, 128 and 129 are deasserted. If the value of stretch signal 104 is 2, both of the doubled processor cycles are stretched by state decoder 130. Consequently, stretch both cycles 128 is asserted and signals 126, 127 and 129 are deasserted. In an embodiment having active high signals, exemplary values of cycle control signals 125 are shown in Table 1.

TABLE 1

| Stretch 104 | First 126 | Second 127 | Both 128 | Normal 129 | Mask 122 |
|---|---|---|---|---|---|
| 0 | 0 | 0 | 0 | 1 | 0 |
| 1 | 0 | 1 | 0 | 0 | 1 |
| 2 | 0 | 0 | 1 | 0 | 1 |
| 3 | 1 | 0 | 0 | 0 | 1 |

State decoder 130 receives the states A–H from state counter 110 and the cycle control signals 125 from stretch cycle sequencer 120, and determines various clock signals based upon the states of these signals. In one embodiment, state decoder 130 includes four clock circuits PH1 circuit 132, PH2 circuit 134, EPH1 circuit 136 and EPH2 circuit 137, which determine preregistered processor clock signals PH1_D, PH2_D, EPH1_D and EPH2_D. State decoder 130 provides the preregistered processor clock signals to registers 140, 142, 144 and 146 which provide processor clocks PH1 141, PH2 143, EPH1 145 and EPH2 147, respectively.

Figure 2:
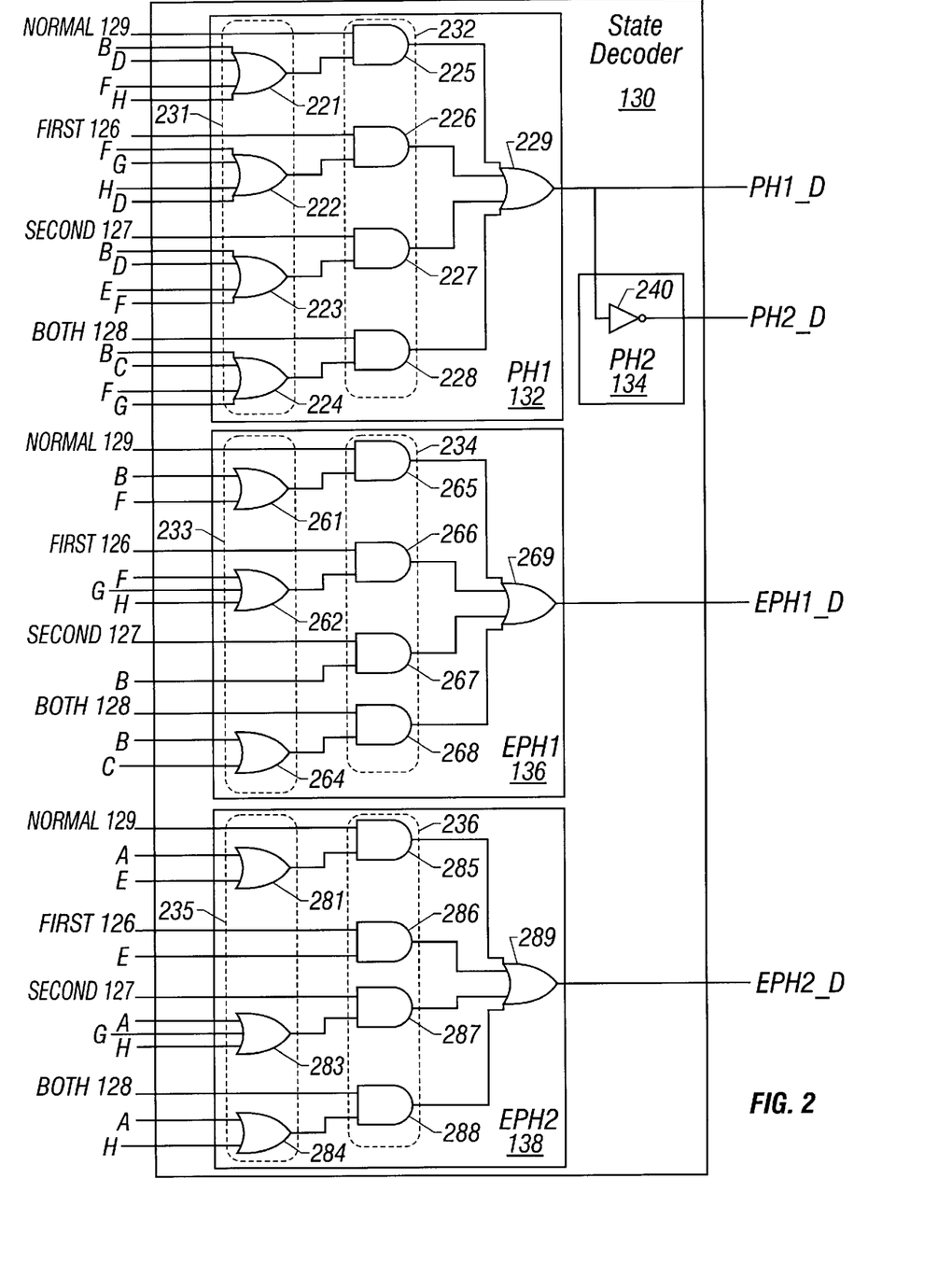
FIG. 2 shows an exemplary state decoder of the clock generation circuit according to an embodiment of the present invention.

FIG. 2 depicts an exemplary state decoder 130 according to an embodiment of the invention. State decoder 130 receives states A–H over state lines 115 from state counter 110 and cycle control lines 126–129 form stretch cycle sequencer 120 to generate the preregistered processor clocks PH1_D, PH2_D, EPH1_D and EPH2_D. Preregistered processor clocks PH1_D, PH2_D, EPH1_D and EPH2_D are generated by PH1 circuit 132, PH2 circuit 134, EPH1 circuit 136 and EPH2 circuit 138, respectively.

In the embodiment of FIG. 2, state decoder 130 includes a first tier of OR gates which collect the particular pulses on the state input lines 115A–H to generate combined state signals. Each of the combined state signals corresponds to a processor clock and a stretch cycle type. State decoder 130 further includes a second tier of AND gates receiving the combined state signals and cycle control signals 126–129 for selecting the stretch cycle type for the corresponding processor clock. Each gate of the second tier of AND gates produces one of two outputs. The first output is the combined clock signal if the AND gate is selected by an asserted cycle control signal input. The second output is a continuous low if the AND gate is not selected by a deasserted cycle control signal input. State decoder 130 further includes a third tier of OR gates which gather the outputs of the second tier and pass on the selected clock signal.

No first tier OR gates are required where a single state pulse is used to construct the clock signal. For example, if a second cycle is stretched, EPH1_D is derived solely from state B, and no first tier OR gate is required.

Figure 3:
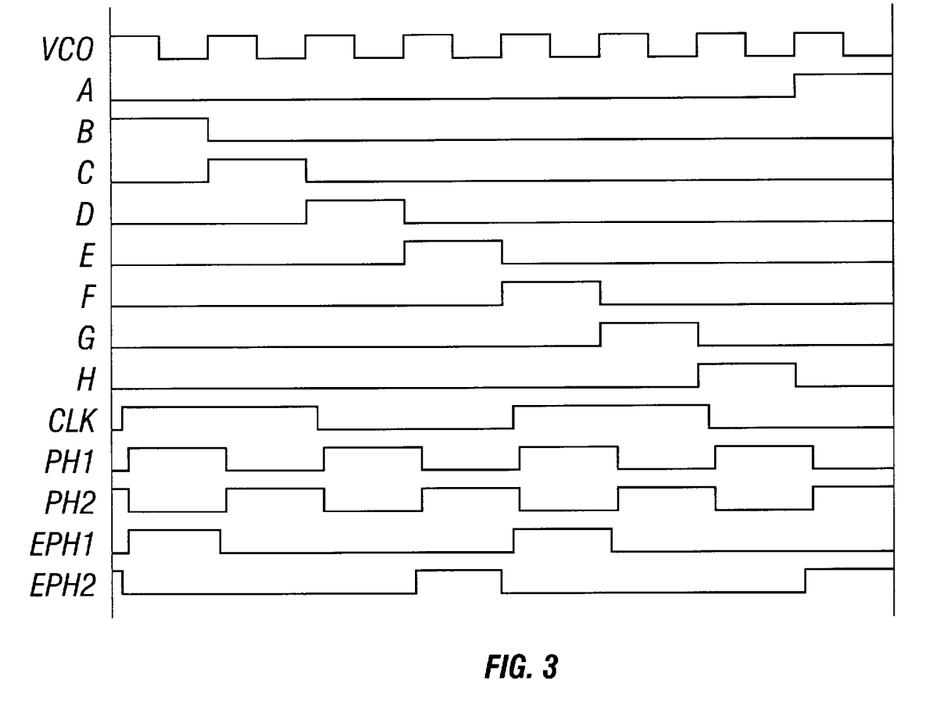
FIG. 3 shows a timing diagram of normal mode clock generation of the processor according to an embodiment of the present invention.
Figure 4:
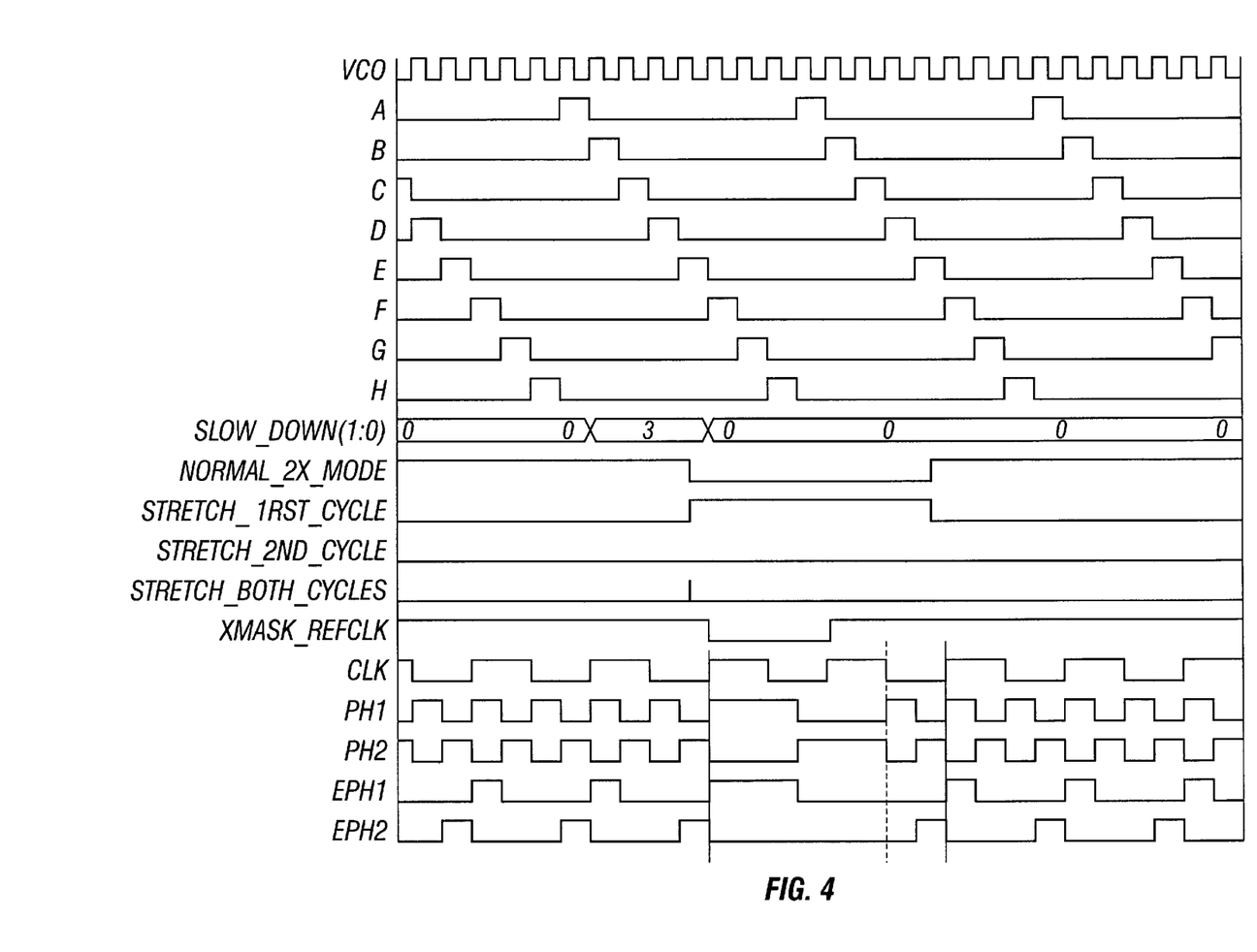
FIG. 4 shows a timing diagram of first-cycle-stretch debug clock generation of the processor according to an embodiment of the present invention.
Figure 5:
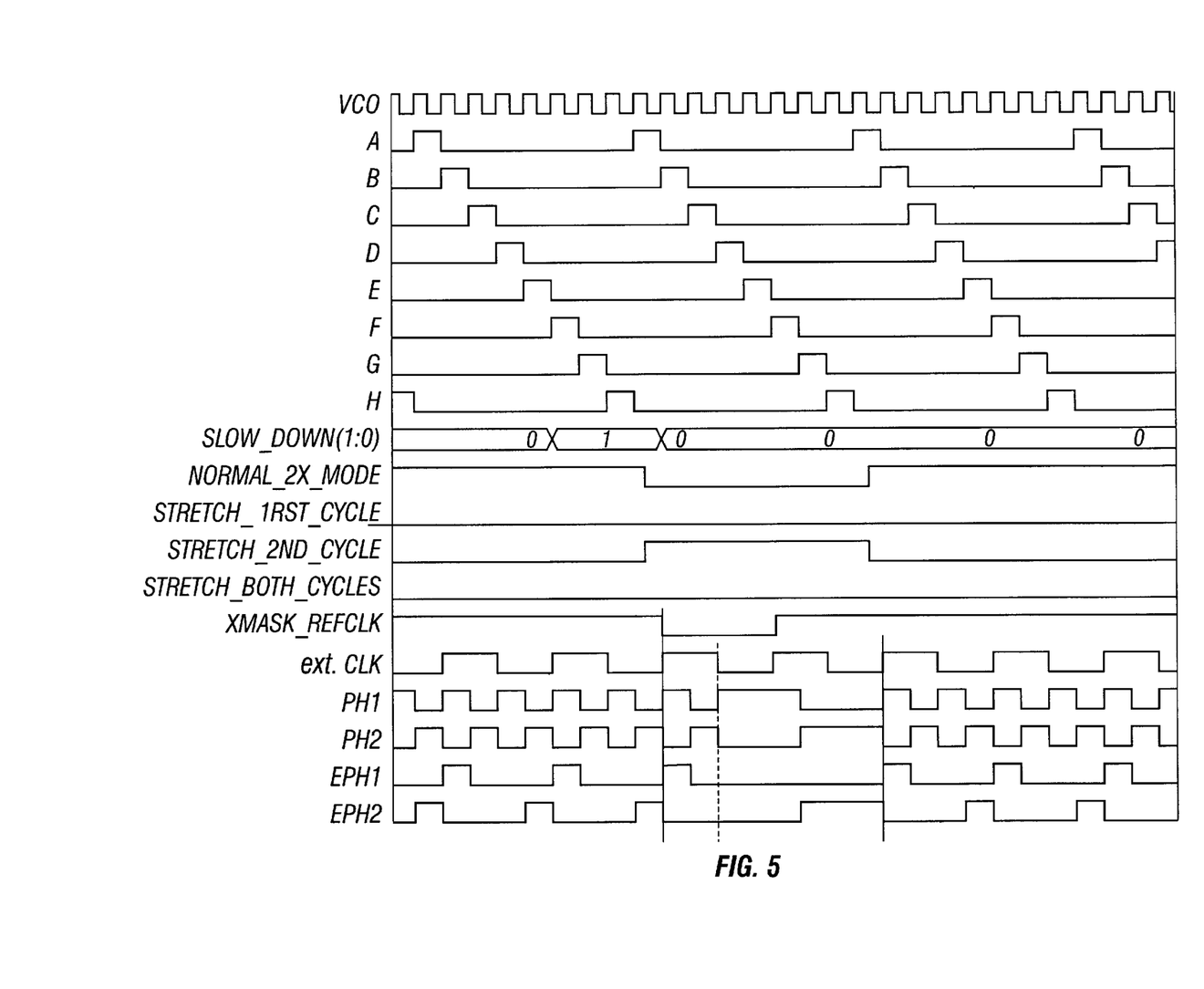
FIG. 5 shows a timing diagram of second-cycle-stretch debug clock generation of the processor according to an embodiment of the present invention.
Figure 6:
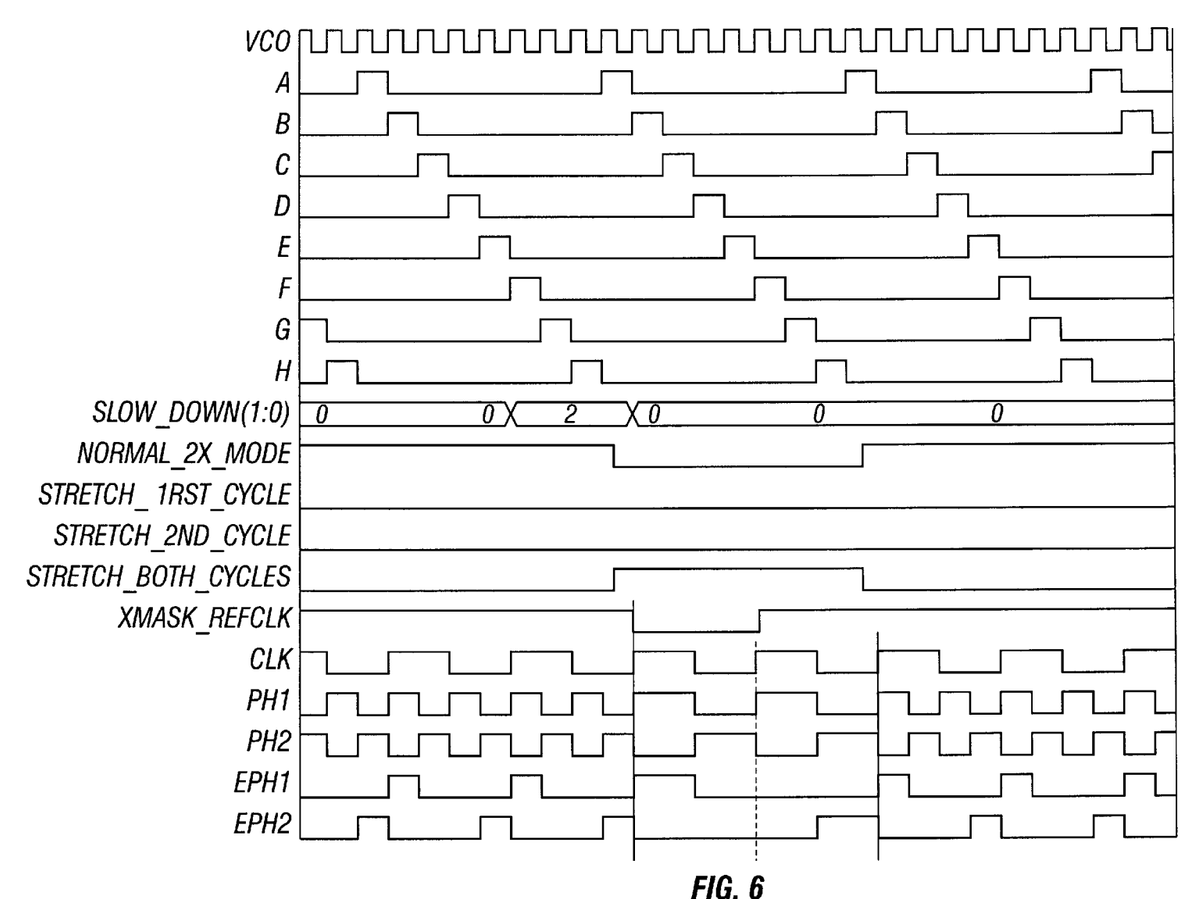
FIG. 6 shows a timing diagram of both-cycle-stretch debug clock generation of the processor according to an embodiment of the present invention.

Specifically, PH1 circuit 132 provides the PH1_D processor clock. PH1 circuit 132 includes a first tier of OR gates 221, 222, 223 and 224 which collect the pulses on state lines 115A–H. For example, OR gate 221 receives states B, D, F and H via state lines 115B, 115D, 115F and 115H. Referring to FIG. 3, because a pulse is issued on state lines 115A–H starting at 115A and proceeding to 115H every cycle of VCO, and because OR gate 221 collects state lines 115A, 115B, 115F and 115H, OR gate 221 outputs a pulse every other VCO cycle. OR gate 222 receives states F, G, H and D via state lines 115F, 115G 115H and 115D. Referring to FIG. 4, the output of OR gate 222 is high during states F, G, H and D. OR gate 223 receives states B, D, E and F via state lines 115B, 115D, 115E and 115F. Referring to FIG. 5, the output of OR gate 223 is high during states B, D, E and F. OR gate 224 receives states B, C, F and G via state lines 115B, 115C, 115F and 115G. Referring to FIG. 6, the output of OR gate 224 is high during states B, C, F and G.

Referring again to FIG. 2, PH1 circuit 132 further includes a second tier of AND gates for selecting the combined clock signal that is passed to the system. For example, AND gate 225 receives the OR gate 221 combined clock and normal clock operation signal 129. AND gate 225 passes the OR gate 221 combined clock if normal clock operation signal 129 is asserted indicating normal 2X clock operation. AND gate 226 receives the OR gate 222 combined clock and stretch first cycle 126. AND gate 226 passes the OR gate 222 combined clock if enabled by an asserted stretch first cycle 126. AND gate 227 receives the OR gate 223 combined clock and stretch second cycle 127. AND gate 227 passes the OR gate 223 combined clock if enabled by an asserted stretch second cycle 127. AND gate 228 receives the OR gate 224 combined clock and stretch both cycles 128. AND gate 228 passes the OR gate 224 combined clock if enabled by an asserted stretch both cycles 128.

PH1 circuit 132 further includes OR gate 229 which gathers the outputs of AND gates 225, 226, 227 and 228 and passes on the selected combined clock signal. Only one AND gate of AND gates 225, 226, 227 and 228 produces a varying output. All other AND gates are held low. For example, during normal 2X clock operation, the states B, D, F and H are collected at OR gate 221, passed on by enabled AND gate 225 and received by OR gate 229. The other inputs to OR gate 229 are held low because when normal clock operation signal 129 is asserted, the other clock cycle control signals 125 (stretch first cycle 126, stretch second cycle 127 and stretch both cycles 127) are deasserted. Thus, in this example, the output of OR gate 229 is high only when the output of OR gate 221 is high. In other words, OR gate 229 outputs a pulse every other VCO cycle.

In the embodiment of FIG. 2, PH2_D is the inverse of PH1_D. Although PH2_D could be constructed by adding another set of tiered gates, PH2_D is more simply derived from NOT gate 134 which receives PH1_D as an input.

EPH1 circuit 136 and EPH2 circuit 138 perform similar functions as PH1 circuit 132 with regard to preregistered processor clocks EPH1_D and EPH2_D. The first tier EPH1 OR gates 261–264 and EPH2 OR gates 281–284 each receive different state signals than PH1 OR gates 221–224. The type of signals desired during each cycle type for EPH1 143 and EPH2 147 dictate the state signals received by OR gates 261–264 and 281–284. The first tier OR gates 261–264 and 281–284 collect the state signals. The second tier AND gates 265–268 and 285–288 select which of the collected clocks is passed. The third tier OR gates 269 and 289 collect the selected collected clocks to provide EPH1_D and EPH2_D, respectively.

The clock signals provided by state decoder 130 are defined by the following logic equations:

$PH1\_D=(B+D+F+H)\text{NORMAL}+(E+G+H+D)\text{FIRST}+(B+D+E+F)\text{SECOND}+(B+C+F+G)\text{BOTH}$ $PH2\_D=\text{NOT}(PH1\_D)$ $EPH1\_D=(B+F)\text{NORMAL}+(F+G+H)\text{FIRST}+(B)\text{SECOND}+(B+C)\text{BOTH}$ $EPH2\_D=(A+E)\text{NORMAL}+(E)\text{FIRST}+(A+G+H)\text{SECOND}+(A+H)\text{BOTH}$ In the embodiment of FIG. 2, AND gates, OR gates and an inverter are used to provide the processor clocks. In other embodiments, the functionality of state decoder 130 may be implemented using other logic sets. For example, state decoder 130 could be implemented by using a first tier of OR gates receiving the appropriate signals 115A–H followed by a second tier of multiplexers or tristatable buffers receiving the OR gate outputs as data inputs and receiving cycle control signals 126–129 as control lines for selecting from among the outputs of the OR gates. If the second tier includes tristatable gates, the third tier of OR gates is not necessary. Also, state decoder 130 could be fully implemented with NAND gates or with any other combination of gates that are functionally complete. Thus, the embodiment of FIG. 2 may be implemented in any number of ways, and the embodiment of FIG. 2 merely provides an illustration of the logical functionality of state decoder 130.

Furthermore, physical circuit requirements will often dictate the type of logic implementation. For example, factors such as the number of transistors required for each gate can dictate the types of gates used. Also, timing requirements of the circuit and the substrate may require modifications to the circuit presented in FIG. 2. Various physical implementations of the functionality of FIG. 2 can look quite different from the embodiment presented in FIG. 2, but will be logically equivalent to FIG. 2. The above mentioned modifications and variations will be apparent to those skilled in the art.

FIG. 3 depicts a timing diagram showing the operation of clock generation circuit 100 during normal 2X mode operation. VCO clocks state counter 110 which produces pulses on lines 115A–H. Each line 115A–H is pulsed in sequence, and one line is pulsed for each period of VCO. The PLL produces VCO by doubling the external clock. Clock signal PH1 is an OR of lines B, D, F and H. Clock signal PH2 is an OR of lines C, E, G and A. Alternatively, PH2 is the inverse of PH1. Clock signal EPH1 is an OR of B and F. Clock signal EPH2 is an OR of E and A.

Referring again to FIG. 2 in the context of normal 2X mode operation, of the four cycle control signals normal 129, first 126, second 127 and both 128, only normal 129 is asserted. Because only normal 129 is asserted, the outputs of OR gates 221, 261 and 281 are driven to the processor clock outputs PH1, EPH1 and EPH2, respectively. Thus, as shown in FIGS. 2 and 3, PH1 is an OR of lines B, D, F and H, PH2 is the inverse of PH1, EPH1 is an OR of B and F, and EPH2 is an OR of E and A.

Referring again to FIG. 1, to generate a stretch cycle, stretch signal 104 is asserted one external clock cycle before the required internal stretch cycle. On the next external clock, stretch cycle sequencer 120 generates the proper sequence of pulses on the cycle control signals 125 which are provided to state decoder 130 where they are used to modify the main clock pulses being generated to create a stretch cycle. Cycle control signals 125 and the resulting processor clock signals are illustrated in the wave forms shown in FIGS. 4–6. As FIGS. 4–6 show, there are three possible types of stretch cycles which are selected by asserting one of three different bit patterns on stretch signal 104. Any number of stretch cycles of any type can be strung together to generate the required internal clock behavior.

FIG. 4 depicts a timing diagram showing the operation of clock generation circuit 100 causing a stretch cycle with the first half of a state counter 110 cycle stretched. VCO clocks state counter 110 which produces pulses on lines 115A–H. Each line 115A–H is pulsed in sequence, and one line is pulsed for each period of VCO. The PLL produces VCO by doubling the external clock. During the normal clock cycles, clock signals PH1, PH2, EPH1 and EPH2 are determined according to normal 2X mode operation as discussed above. Referring to FIGS. 2 and 4, during a first half cycle stretch, clock signal PH1 is an OR of lines F, G, H and D. Clock signal PH2 is an OR of lines A, B, C and E. Alternatively, PH2 is the inverse of PH1. Clock signal EPH1 is an OR of F, G and H. Clock signal EPH2 is an OR of E. A pulse of clock signal EPH1 is stretched during a first half cycle stretch.

Referring again to FIG. 2 in the context of a stretch cycle with the first half of the cycle stretched, only first 126 of the four cycle control signals 125 is asserted. Because only stretch first cycle 126 is asserted, the outputs of OR gates 222 and 262 and state line 115E are driven to the processor clock outputs PH1, EPH1 and EPH2, respectively. Thus, as shown in FIGS. 2 and 4, PH1 is an OR of lines F, G, H and D; PH2 is the inverse of PH1; EPH1 is an OR of F, G and H; and EPH2 is E.

FIG. 5 depicts a timing diagram showing the operation of clock generation circuit 100 causing a stretch cycle with the second half of the cycle stretched. The depicted operation of VCO, CLK and states A–H remains as in FIG. 4. Referring to FIGS. 2 and 5, during a second half stretch cycle, clock signal PH1 is an OR of lines B, D, E and F. Clock signal PH2 is an OR of lines C, G, H and A. Alternatively, PH2 is the inverse of PH1. Clock signal EPH1 is state B. Clock signal EPH2 is an OR of G, H and A. A pulse of clock signal EPH2 is stretched during a second half cycle stretch.

Referring again to FIG. 2 in the context of a stretch cycle with the second half of the cycle stretched, only stretch second cycle 127 of the four cycle control signals 126–129 is asserted. Because only stretch second cycle 127 is asserted, the output of OR gate 223, state line 115B and the output of OR gate 283 are driven to the processor clock outputs PH1, EPH1 and EPH2, respectively. Thus, as shown in FIGS. 2 and 5, PH1 is an OR of lines B, D, E and F; PH2 is the inverse of PH1; EPH1 is B; and EPH2 is an OR of lines A, G and H.

FIG. 6 depicts a timing diagram showing the operation of clock generation circuit 100 causing a stretch cycle with the both halves of the cycle stretched. The depicted operation of VCO, CLK and states A–H remains as in FIG. 4. Referring to FIGS. 2 and 6, during a cycle in which both half cycles are stretched, clock signal PH1 is an OR of lines B, C, F and G. Clock signal PH2 is an OR of lines D, E, H and A. Alternatively, PH2 is the inverse of PH1. Clock signal EPH1 is an OR of B and C. Clock signal EPH2 is an OR of H and A. A pulse of clock signal EPH1 and a pulse of clock signal EPH2 are stretched during a both-halves cycle stretch.

Referring again to FIG. 2 in the context of a stretch cycle with both halves of the cycle stretched, only stretch both cycles 128 of the four cycle control signals 125 is asserted. Because only stretch both cycles 128 is asserted, the output of OR gates 224, 264 and 284 are driven to the processor clock outputs PH1, EPH1 and EPH2, respectively. Thus, as shown in FIGS. 2 and 6, PH1 is an OR of lines B, C, F and G; PH2 is the inverse of PH1; EPH1 is an OR of lines B and C; and EPH2 is an OR of lines A and H.

On the rising edge of VCO, the output registers 140, 142, 144 and 146 are updated, based on the current state of preregistered signals PH1_D, PH2_D, EPH1_D and EPH2_D, to generate the proper edges on all four processor clock signals PH1 141, PH2 143, EPH1 145 and EPH2 147. The state counter is advanced to the next state on the rising edge of VCO.

Figure 7:
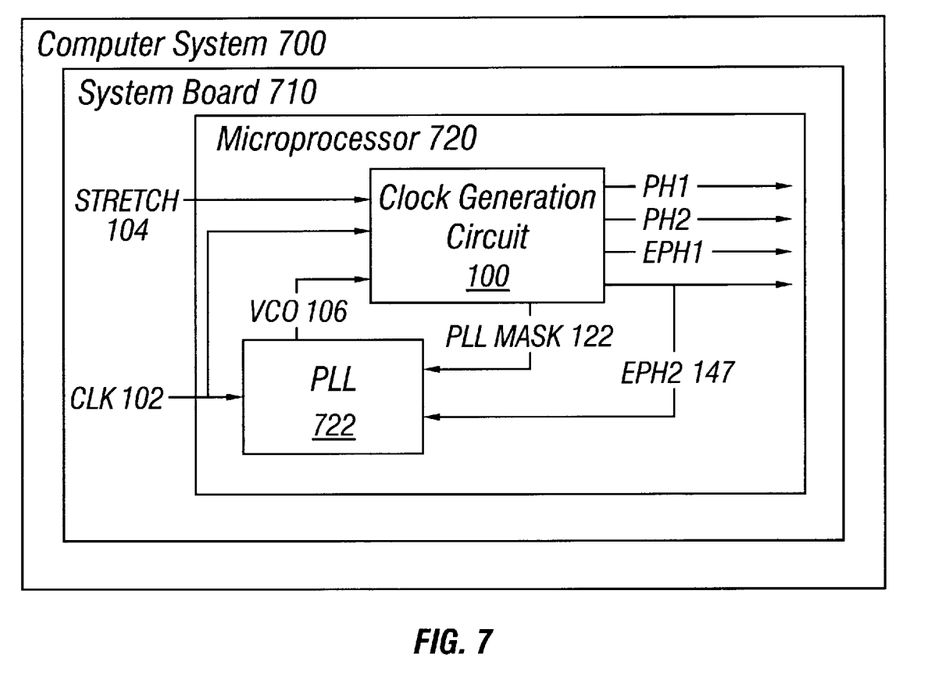
FIG. 7 shows a computer system with clock generation circuitry according to an embodiment of the present invention.

FIG. 7 depicts a computer system 700 including system board 710. System board 710 includes microprocessor 720. Microprocessor 720 includes clock generation circuit 100, and a phase locking circuit such as PLL 722. Clock generation circuit 100 receives stretch signal 104, external clock signal 102, and VCO 106 to generate the processor clocks necessary for processor 720. Clock generation circuit 100 provides PLL mask signal 122 and clock signal EPH2 147 to PLL 722. Clock signal EPH2 provides a feedback signal so that PLL 722 can maintain a phase lock between processor clocks PH1, PH2, EPH1, EPH2 and external clock 102. Clock generation circuit 100 provides PLL mask signal 122 to PLL 722 to disable phase locking during a stretch cycle so that VCO 106 is substantially unaffected by clock stretch when PLL mask signal 122 has a value indicative of a stretch cycle.

While the invention has been described with reference to various embodiments, it will be understood that these embodiments are illustrative and that the scope of the invention is not limited to them. Many variations, modifications, additions, and improvements of the embodiments described are possible. Those skilled in the art will recognize that boundaries between logic blocks are merely illustrative and that alternative embodiments may merge logic blocks or impose an alternate decomposition of functionality for clock generation circuit 100. Indeed, state counters and decoders (illustratively, 110 and 130) may be merged or phase circuits 132, 134, 136 and 138 may be separate high level logic blocks. Moreover, alternative embodiments may combine multiple instances of a particular component. For example, individual instances of selection logic (illustratively, 225, 226, 227, 228, 265, 285 etc.) may be implemented as a single block. Alternative embodiments may provide state counter 110 as a binary or gray code counter, a ripple counter, or other state machine with corresponding state decode features to provide the states to state decoder 130. Corresponding modifications to state decoder 130 will be apparent to those skilled in the art. Furthermore, the 2X clock operation described herein is merely illustrative and a variety of additional and/or alternative clock operation types may be analogously provided in accordance with the present invention. These and other variations, modifications, additions, and improvements may fall within the scope of the invention as defined in the claims which follow.

What is claimed is:

1. A clock generating circuit comprising:
   a clock generator coupled to receive a reference oscillating signal, the clock generator providing a clock signal responsive to the reference oscillating signal; and
   a stretch cycle controller coupled to receive the reference oscillating signal and coupled to provide a cycle control signal to the clock generator, the clock generator stretching a cycle of the clock signal responsive to a value of the cycle control signal to generate a clock signal stretch cycle; wherein
   the clock generator comprises:
      a state counter for generating a repeating sequence of states; and
      a state decoder for providing the clock signal, the clock signal being determined by the states of the state counter and the cycle control signal;

the state counter is coupled to provide a plurality of state lines to the state decoder, each state line corresponding to one of the states of the state counter;

the state decoder includes a combination circuit for combining the state lines to generate a plurality of combined state signals, the plurality of combined state signals including a first combined state signal providing a normal operation clock signal, and a second combined state signal providing a stretched clock signal including the clock signal stretch cycle; and a selection circuit for selecting one of the first and second combined state signals to provide the clock signal.

2. The clock generating circuit of claim 1, wherein the stretch cycle controller is coupled to receive a debug control signal and to provide the cycle control signal to the selection circuit, the cycle control signal selecting the first combined state signal responsive to a first value of the debug control signal, the cycle control signal selecting the second combined state signal responsive to a second value of the debug control signal.

3. A clock generating circuit comprising:

a clock generator coupled to receive a reference oscillating signal, the clock generator providing a clock signal responsive to the reference oscillating signal; and a stretch cycle controller coupled to receive the reference oscillating signal and coupled to provide a cycle control signal to the clock generator, the clock generator stretching a cycle of the clock signal responsive to a value of the cycle control signal to generate a clock signal stretch cycle; wherein the clock signal comprises a first clock signal and a second clock signal;

the clock generator is coupled to provide the first clock signal and the second clock signal responsive to receiving the reference oscillating signal;

the stretch cycle controller is coupled to receive a stretch signal and to provide the cycle control signal for stretching at least one cycle of at least one of the first and second clock signals responsive to a value of the stretch signal;

the clock generator includes a state counter having a counter cycle, the counter cycle having a cycle time at least twice as long as a longest period of periods of the first and second clock signals; and the cycle control signal comprises at least three cycle control signals, the at least three cycle control signals including a first cycle control signal for stretching the at least one of the first and second clock signals during a first half of the counter cycle responsive to the stretch signal indicating a first half cycle stretch;

a second cycle control signal for stretching the at least one of the first and second clock signals during a second half of the counter cycle responsive to the stretch signal indicating a second half cycle stretch; and a third cycle control signal for stretching the at least one of the first and second clock signals during the first half of the counter cycle and the second half of the counter cycle responsive to the stretch signal indicating a both-halves cycle stretch.

4. The clock generating circuit of claim 3, wherein the cycle control signal further comprises a fourth cycle control signal for indicating to the clock generator that the first and second clock signals are not stretched responsive to the stretch signal indicating normal clock operation.

5. The clock generating circuit of claim 3, wherein the clock generator further provides a third clock signal and a fourth clock signal responsive to receiving the reference clock signal, each of the third clock signal and the fourth clock signal having a period longer than the periods of the first and second clock signals;

the first cycle control signal stretches the third clock signal during the first half of the counter cycle responsive to the stretch signal indicating a first half cycle stretch;

the second cycle control signal stretches the fourth clock signal during a second half of the counter cycle responsive to the stretch signal indicating a second half cycle stretch; and the third cycle control signal stretches the third and fourth clock signals during the first half of the counter cycle and the second half of the counter cycle responsive to the stretch signal indicating a both-halves cycle stretch.

6. The clock generating circuit of claim 5, wherein the cycle control signal further comprises a fourth cycle control signal for indicating to the clock generator that the third and fourth clock signals are not stretched responsive to the stretch signal indicating normal clock operation.

7. A clock generating circuit comprising:

a clock generator coupled to receive a reference oscillating signal, the clock generator providing a clock signal responsive to the reference oscillating signal;

a stretch cycle controller coupled to provide a cycle control signal to the clock generator, the clock generator stretching a cycle of the clock signal responsive to a value of the cycle control signal to generate a clock signal stretch cycle; and a phase locking circuit coupled to provide the reference oscillating signal to the clock generator and the stretch cycle controller, and coupled to receive the clock signal from the clock generator and a mask signal from the stretch cycle controller to mask the clock signal from the phase locking circuit during a stretch cycle.

8. The clock generating circuit of claim 7, wherein the mask signal is provided to disable a phase comparison in the phase locking circuit during cycles of the clock signal that are stretched by the stretch cycle controller.

9. An apparatus for stretching clock signals in a computer system, the apparatus comprising:

a stretch control circuit coupled to receive a reference clock signal and coupled to receive a debug signal, the stretch control circuit providing at least one control signal responsive to the debug signal; and a stretch functional circuit coupled to receive the at least one control signal from the stretch control circuit and coupled to receive the reference clock signal, the stretch functional circuit for providing a plurality of apparatus clock signals, the stretch functional circuit stretching a cycle of at least one of the apparatus clock signals responsive to the at least one control signal to generate a stretch cycle of the at least one of the apparatus clock signals; wherein the stretch functional circuit includes a state machine for providing state information, the state information identifying the state of the state machine; and a state decoder for receiving the state information from the state machine, the state decoder providing the apparatus clock signals, each apparatus clock signal being determined by at least a portion of the state information selected by the at least one control signal; and wherein the state information is represented as a plurality of state bits, each state bit being asserted when the state machine is in a corresponding state; and the state decoder comprises:
a circuit for combining values of the state bits to generate a plurality of combined state signals, the plurality of combined signals including
a first combined state signal providing a normal operation clock signal, and
a second combined state signal providing a stretched clock signal; a selection circuit for selecting one of the first and second combined state signals to provide the at least one apparatus clock signal.

10. The apparatus of claim 9, wherein the at least one control signal selects the first combined state signal responsive to a first value of the debug signal, the at least one control signal selecting the second combined state signal responsive to a second value of the debug signal.

11. The apparatus of claim 9, wherein the at least one control signal from the stretch control circuit controls the stretch functional circuit to generate a double-stretched clock signal responsive to the at least one control signal.

12. The apparatus of claim 9, wherein the at least one control signal from the stretch control circuit controls the stretch functional circuit to generate the stretched clock signal during a first cycle responsive to a first value of the at least one control signal and to generate the stretched clock signal during a second cycle responsive to a second value of the at least one control signal.

13. The apparatus of claim 9, wherein the circuit for combining values of the state bits includes a logical-OR circuit.

14. An apparatus for stretching clock signals in a computer system, the apparatus comprising:
a stretch control circuit coupled to receive a debug signal and a reference clock signal, the stretch control circuit providing at least one control signal responsive to the debug signal;
a stretch functional circuit coupled to receive the at least one control signal from the stretch control circuit and coupled to receive the reference clock signal, the stretch functional circuit for providing a plurality of apparatus clock signals, the stretch functional circuit stretching a cycle of at least one of the apparatus clock signals responsive to the at least one control signal to generate a stretch cycle of the at least one of the apparatus clock signals; and
a phase locking circuit coupled to the stretch control circuit and the stretch functional circuit for providing the reference clock signal, the phase locking circuit including an output, the stretch control circuit providing a mask signal to the phase locking circuit to allow the output of the phase locking circuit to remain substantially unaffected by clock stretch when the mask signal has a first value.

15. An apparatus for stretching clock signals, the apparatus comprising:
means for providing a stretch control signal responsive to receiving a debug stretch cycle signal;
means for providing a clock signal, the clock signal having a period, the means for providing the clock signal including means for stretching the period of the clock signal responsive to a first value of the stretch control signal to generate a stretch cycle of the clock signal; and
a phase locked loop means coupled to receive the clock signal and to receive a mask signal from the means for providing the stretch control signal, the mask signal being for masking the clock signal, the phase locked loop means being coupled to provide an oscillating signal derived from the clock signal and the mask signal to the means for providing the stretch control signal and the means for providing the clock signal.

16. An apparatus comprising:
a counter coupled to receive an oscillating signal and coupled to provide a plurality of state lines for indicating the state of the counter;
a stretch cycle controller coupled to receive the oscillating signal and coupled to provide a cycle control signal; and
a state decoder coupled to receive the state lines and the cycle control signal and coupled to provide a clock signal, the state decoder including
a combination circuit for combining sets of the state lines to generate a plurality of combined state signals, the plurality of combined state signals including
a first combined state signal providing a normal operation clock signal, and
a second combined state signal providing a stretched clock signal including a stretch cycle; and
a selection circuit for selecting one of the first and second combined state signals to provide the clock signal.

17. The apparatus of claim 16 further comprising:
a phase locked loop circuit coupled to receive the clock signal and to receive a mask signal from the stretch cycle controller for masking the clock signal, and coupled to provide the oscillating signal derived from the clock signal and the mask signal to the counter, the stretch cycle controller and the state decoder.

18. A microprocessor comprising:
a state machine coupled to receive an oscillating signal and coupled to provide a plurality of state lines for indicating the state of the state machine;
a stretch cycle controller coupled to receive the oscillating signal and coupled to provide a cycle control signal; and
a state decoder coupled to receive the state lines and the cycle control signal and coupled to provide a clock signal, the state decoder including
a combination circuit for combining sets of the state lines to generate a plurality of combined state signals, the plurality of combined state signals including
a first combined state signal providing a normal operation clock signal, and
a second combined state signal providing a stretched clock signal including a stretch cycle; and
a selection circuit for selecting one of the first and second combined state signals to provide the clock signal.

* * * * *